US006803815B1

United States Patent
Nishikido

(10) Patent No.: US 6,803,815 B1
(45) Date of Patent: Oct. 12, 2004

(54) AMPLITUDE MODULATION DEMODULATION CIRCUIT

(75) Inventor: Osamu Nishikido, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 72 days.

(21) Appl. No.: 10/252,578

(22) Filed: Sep. 24, 2002

(30) Foreign Application Priority Data

Apr. 5, 2002 (JP) ........................................ 2002-104164

(51) Int. Cl.⁷ ............................ H03D 1/00; H03D 1/24
(52) U.S. Cl. ..................... 329/347; 375/320; 375/338; 329/360
(58) Field of Search ................................. 329/347, 358, 329/360; 375/320, 338, 339

(56) References Cited

U.S. PATENT DOCUMENTS 3,984,778 A * 10/1976 Bhopale ..................... 375/321
4,253,189 A * 2/1981 Lemoussu et al. .......... 375/320
2002/0196870 A1 * 12/2002 Nishikido .................... 375/320

FOREIGN PATENT DOCUMENTS

| JP | 6-319091 | 11/1994 |
|---|---|---|
| JP | 7-67050 | 10/1995 |
| JP | 11-225302 | 8/1999 |
| JP | 02003008354 A * | 1/2003 |

* cited by examiner

Primary Examiner—Robert Pascal
Assistant Examiner—Joseph Chang
(74) Attorney, Agent, or Firm—Leydig, Voit & Mayer, Ltd.

(57) ABSTRACT

A first automatic phase control (APC) detection circuit generates an APC detection signal having normal polarity from an amplitude modulation signal and APC detection reference signal. A second APC detection circuit generates an APC detection signal having reverse polarity from the amplitude modulation signal and the APC detection reference signal. A switch selects the APC detection signal having normal polarity in case of normal modulation and selects the APC detection signal having reverse polarity in case of overmodulation.

16 Claims, 11 Drawing Sheets

INPUT SIGNAL

PHASE DIFFERENCE OF 0°

PHASE DIFFERENCE OF 180°

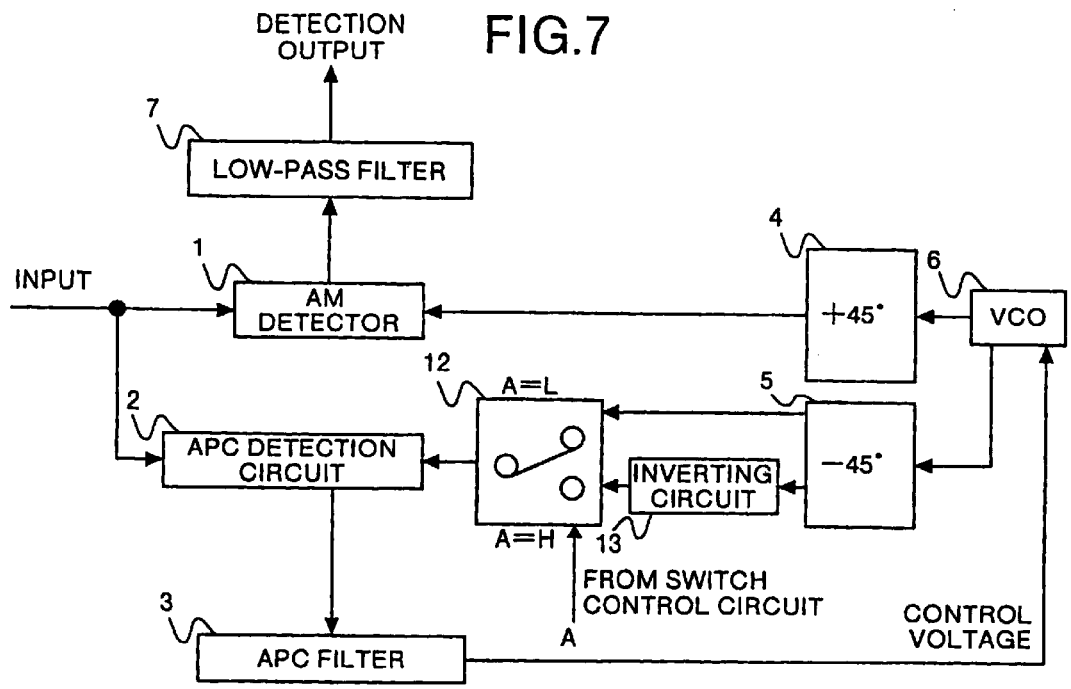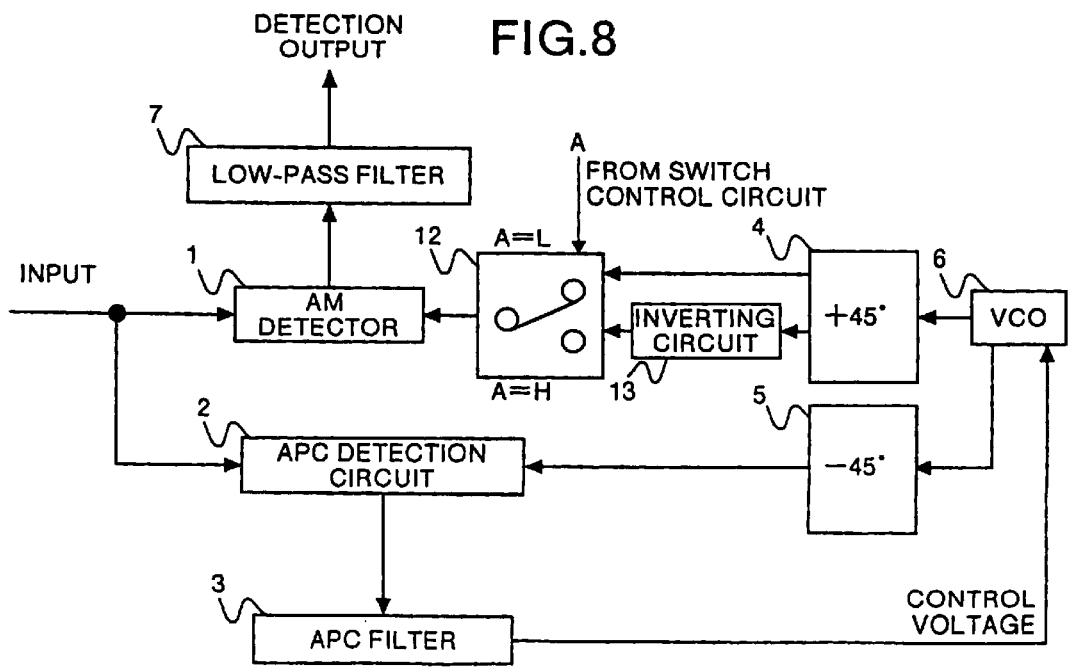

AMPLITUDE MODULATION DEMODULATION CIRCUIT

BACKGROUND OF THE INVENTION

1) Field of the Invention

The present invention relates to an amplitude modulation (AM) demodulation circuit using a phase locked loop (PLL) in various aspects of an integrated circuit.

2) Description of the Related Art

FIG. 12 is a block diagram that shows an example of construction of a conventional AM demodulation circuit using a PLL. An operation of the AM demodulation circuit will be explained below with reference to FIG. 12. An input signal is input to an AM detector 1. In the AM detector 1, waveform detection is performed by multiplying the input signal and an AM detection reference signal obtained by shifting an output of a voltage control oscillator (VCO) 6 by +45 degrees by means of a phase shift circuit 4. A low-pass filter 7 removes a harmonic component from the detected waveform and outputs the detected waveform ("detection output"). The oscillation frequency of the VCO 6 is determined by a PLL ("APC loop") formed by the VCO 6, an automatic phase control (APC) detection circuit, an APC filter 3, and a phase shift circuit 5. The APC detection circuit 2 compares the input signal with a signal obtained by shifting the output of the VCO 6 by −45 degrees by means of a phase shift circuit 5. The APC detection circuit 2 controls the VCO 6 such that the frequencies of the two signals input into it are the same and that the phase of the signal input from the VCO 6 is shifted from the phase of the input signal by −90 degrees. When this condition is satisfied, the signals input into the AM detector 1 will have same frequencies and phases. As a result, AM detection of the input signal becomes possible in the AM detector 1, and a desired waveform can be detected and output. The APC detection circuit 2 controls the VCO 6 such that the frequencies of the two signals input into it are same and that the phase of the signal input from the VCO 6 is shifted from the phase of the input signal by −90 degrees. When this condition is satisfied, the signals input into the AM detector 1 will have same frequencies and phases. As a result, AM detection of the input signal becomes possible in the AM detector 1, and a desired waveform can be detected and output.

However, in the conventional AM demodulation circuit using the PLL, a phenomenon that a detection reference signal is inverted in overmodulation of an input signal occurs. The principle behind the occurrence of this phenomenon will be described below with reference to FIG. 13A through FIG. 13C. FIG. 13A shows ideal output waveforms obtained in normal modulation and overmodulation. FIG. 13B shows an ideal output waveform obtained when the modulation signal is input. FIG. 13C is a diagram which shows an actual output waveform. It is assumed that signals input to the AM detector 1, i.e., the AM modulation signal and the input signal from the phase shift circuit 4 have equal frequencies and a phase difference of 180 degrees therebetween. When the phase difference is 180 degrees, a lower envelope is detected. For this reason, the waveform shown in FIG. 3B is output.

In FIG. 13A, a section which is finely hatched is a section in which the signals are shifted from each other by 180 degrees due to overmodulation. When the input signal is overmodulated and shifted by 180 degrees, the phase difference between two signals input to the APC detection circuit 2 are shifted by 180 degrees from original signals. At this time, since the APC detection circuit 2 controls the VCO 6 such that the relationship returns to the original phase relationship, the carrier wave of the input signal and a signal obtained by shifting the output from the VCO 6 by +45 degrees are shifted by 180 degrees from the signals having the desired phase relationship. Accordingly, as shown in FIG. 13C, the output from the AM detector is inverted.

Conventionally, in order to prevent the signals from being inverted, the following countermeasure is employed. That is, PLL control is stopped when there is overmodulation, or control speed is decreased to prevent signals from following the change in phase caused by overmodulation. However, an APC operation rarely functions in over modulation, so, when this scheme is employed, stability in the overmodulation is poor.

SUMMARY OF THE INVENTION

It is an object of this invention to provide an AM demodulation circuit which prevents an output in overmodulation from being inverted without stopping an APC operation in overmodulation.

The amplitude modulation demodulation circuit according to the present invention includes a first APC detection circuit which generates an APC detection signal of normal polarity from an amplitude modulation signal and APC detection reference signal, a second APC detection circuit which generates an APC detection signal of reverse polarity from an amplitude modulation signal and APC detection reference signal, and a switch which selects the APC detection signal of normal polarity in case of normal modulation and selects the APC detection signal of reverse polarity in case of overmodulation. As a result, APC detection is performed with a normal polarity in normal modulation, and APC detection is performed with an inverted polarity in overmodulation. Therefore, an AM demodulation circuit which prevents the output from being inverted in overmodulation without stopping an APC operation can be advantageously realized.

According to one aspect of the present invention, an APC filter is connected to the output terminal of a switch, a first APC detection circuit is connected to one of the input terminals of the switch, and a second APC detection circuit is connected to the other of the input terminals of the switch. The switch is controlled based on an AND signal between an output from a voltage comparator and a LOCK detection signal of a PLL such that one of the input terminals of the switch is selected in normal modulation and controls the switch by the AND signal such that the other of the input terminals of the switch is selected in overmodulation.

According to still another aspect of the present invention, an APC filter is connected to the output terminal of a switch, a first APC detection circuit is connected to one of the input terminals of the switch, and an inversion circuit and a second APC detection circuit are connected to the other of the input terminals of the switch. The switch is controlled based on an AND signal between an output from a voltage comparator and a LOCK detection signal of a PLL such that one of the input terminals of the switch is selected in normal modulation and controls the switch by the AND signal such that the other of the input terminals of the switch is selected in overmodulation.

According to still another aspect of the present invention, an APC detection circuit is connected to the output terminal of a switch, an AM modulation signal is connected to one of the input terminals of the switch, and an inverting circuit is connected to the other of the input terminals of the switch.

The switch is controlled based on an AND signal between an output from a voltage comparator and a LOCK detection signal of a PLL such that one of the input terminals of the switch is selected in normal modulation and controls the switch by the AND signal such that the other of the input terminals of the switch is selected in overmodulation.

According to still another aspect of the present invention, an AM detector is connected to an output terminal of a first switch, a first phase shifter is connected to one of the input terminal of the first switch, and a second phase shifter is connected to the other input terminal of the first switch. An APC filter is connected to an output terminal of a second switch, a first APC detection circuit is connected to one of the input terminals of the second switch, and a second APC detection circuit is connected to the other of the input terminals of the second switch. The first and second switches are controlled based on an AND signal between an output from the voltage comparator and a LOCK detection signal of a PLL such that one of the input terminals of each of the first and second switches is selected in normal modulation and controls the first and second switches by the AND signal such that the other of the input terminals of each of the first and second switches is selected in overmodulation.

According to still another aspect of the present invention, a first phase shifter is connected to an input terminal of a first switch, an AM detector is connected to one of the output terminals of the first switch, and a APC detection circuit is connected to the other of the output terminals of the first switch. A second phase shifter is connected to an input terminal of a second switch, a APC detection circuit is connected to one of the output terminals of the second switch, and the AM detector is connected to the other of the output terminals of the second switch. The first and second switches are controlled based an AND signal between an output from the voltage comparator and a LOCK detection signal of a PLL such that one of the input terminals of each of the first and second switches is selected in normal modulation and controls the first and second switches by the AND signal such that the other of the input terminals of each of the first and second switches is selected in overmodulation.

According to still another aspect of the present invention, an APC detection circuit is connected to an output terminal of a switch, a second phase shifter is connected to one of the input terminals of the switch, and an inverting circuit is connected to the other of the input terminals of the switch. The switch is controlled based on an AND signal between an output from the voltage comparator and a LOCK detection signal of a PLL such that one of the input terminals of the switch is selected in normal modulation and controls the switch by the AND signal such that the other of the input terminals of the switch is selected in overmodulation.

According to still another aspect of the present invention, an AM detector is connected to an output terminal of a switch, a first phase shifter is connected to one of the input terminals of the switch, and an inverting circuit is connected to the other of the input terminals of the switch. The switch is controlled based on an AND signal between an output from the voltage comparator and a LOCK detection signal of a PLL such that one of the input terminals of the switch is selected in normal modulation and controls the switch by the AND signal such that the other of the input terminals of the switch is selected in overmodulation.

According to still another aspect of the present invention, an AM detector is connected to the output terminal of a switch, an AM modulation signal is connected to one of the input terminals of the switch, and an inverting circuit is connected to the other of the input terminals of the switch. The switch is controlled based on an AND signal between an output from the voltage comparator and a LOCK detection signal of a PLL such that one of the input terminals of the switch is selected in normal modulation and controls the switch by the AND signal such that the other of the input terminals of the switch is selected in overmodulation.

Moreover, the APC detection circuit may be connected to the output terminal of a third switch, the AM modulation signal may be connected to one of the input terminals of the third switch, and an output signal of a second phase shift circuit is connected to the other of the input terminals of the third switch.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 7 is a block diagram which shows the configuration of an AM demodulation circuit according to the sixth embodiment of the present invention, FIG. 8 is a block diagram which shows the configuration of an AM demodulation circuit according to the seventh embodiment of the present invention.

DETAILED DESCRIPTIONS

Embodiments of the AM demodulation circuit according to the present invention will be explained below with reference to the accompanying drawings.

Figure 1:
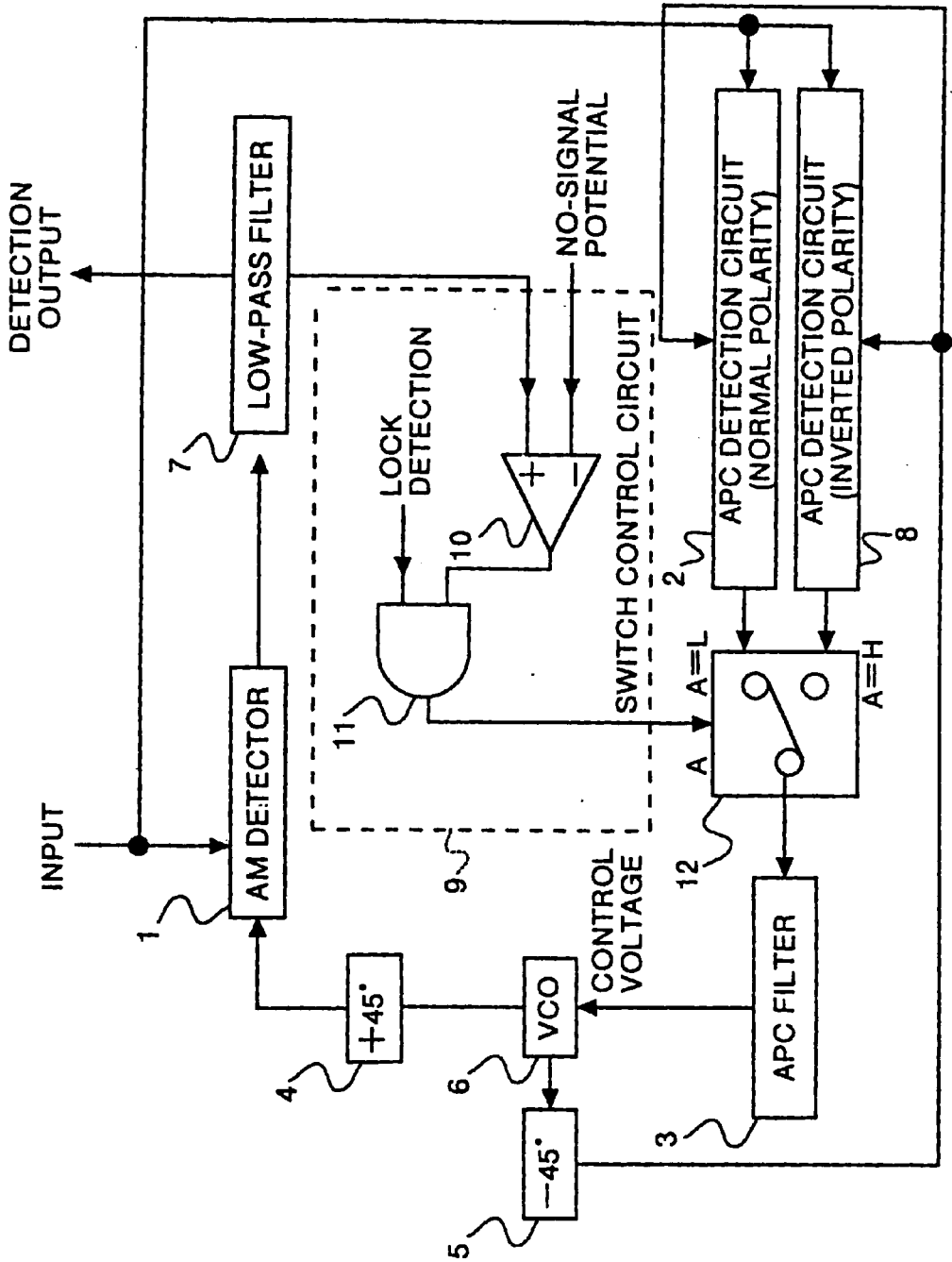
FIG. 1 is a block diagram which shows the configuration of an AM demodulation circuit according to the first embodiment of the present invention.

FIG. 1 is a block diagram which shows the configuration of an AM demodulation circuit according to the first embodiment of the present invention. The AM demodulation circuit shown in FIG. 1 is considerably different from a conventional AM demodulation circuit shown in FIG. 12 in the followings. That is, the AM demodulation circuit comprises a switch control circuit 9 constituted by a voltage comparator 10 and an AND circuit 11. The voltage comparator 10 compares a no-signal potential which is a signal potential of a detection output obtained when an AM signal is not modulated with an AM detection output. The AND circuit 11 calculates a logical AND between an output of the voltage comparator 10 and a LOCK detection signal. There is provided a switch 12 which performs a switching operation between an output from an APC detection circuit 2 and an output from an APC detection circuit 8 based on an output (signal A) of the AND circuit 11. The switch 12 switches to the output from the APC detection circuit 2 when signal A has low logical level (A=L) and to the output from the APC detection circuit 8 when signal A has high logical level (A=H). The APC detection circuit 8 has an inverted polarity obtained by inverting the polarity of the APC detection circuit 2 having a normal polarity. The remaining configuration of the AM demodulation circuit of this embodiment is the same as that of the conventional AM demodulation circuit. The same reference numerals as in the conventional AM demodulation circuit denote the same parts in the AM demodulation circuit according to this embodiment.

The operation of the AM demodulation circuit in FIG. 1 will be explained below. When an input signal is input to the AM detector 1 and the APC detection circuit 2 or the APC detection circuit 8. In the AM detector 1, waveform detection is performed by multiplying the input signal with a signal obtained by shifting an output from the VCO 6 by +45 degrees by means of a phase shift circuit 4 to obtain a. The low-pass filter 7 removes a harmonic component from the waveform detected and outputs the waveform ("detection output"). The output oscillation frequency of the VCO 6 is controlled by the APC detection circuit 2 and the APC filter 3. The APC detection circuit 2 compares the input signal with a signal obtained by shifting the output from the VCO 6 by −45 degrees by means of a phase shift circuit 5 to control the VCO 6 such that an input phase from the VCO 6 is shifted from the phase of the input signal by −90 degrees. On the other hand, the switch 12 switches an output from the APC detection circuit 2 or the APC detection circuit 8 based an AND operation between a comparison result between an AM detection output and a no-signal potential by a voltage comparator and an LOCK detection result. With this switching operation, APC detection with a normal polarity is performed by the APC detection circuit 2 in normal modulation, and APC detection with polarity inverted by the APC detection circuit 8 in overmodulation. At this time, an APC loop is continuously locked because the polarity of the APC detection is changed even though the input phase is inverted in overmodulation. In this manner, the signal input to the AM detector 1 can keep a predetermined frequency and a predetermined phase.

Figure 2A:
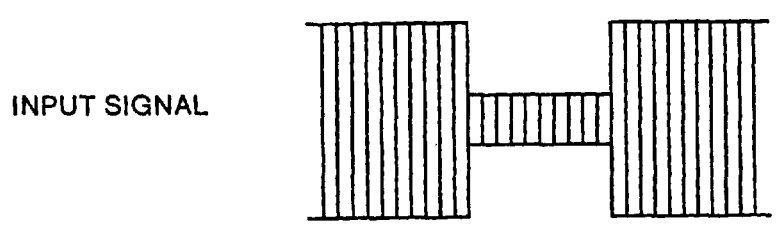
FIG. 2A is a diagram which shows an example of an waveform obtained when an input signal is an AM modulation signal.
Figure 2B:
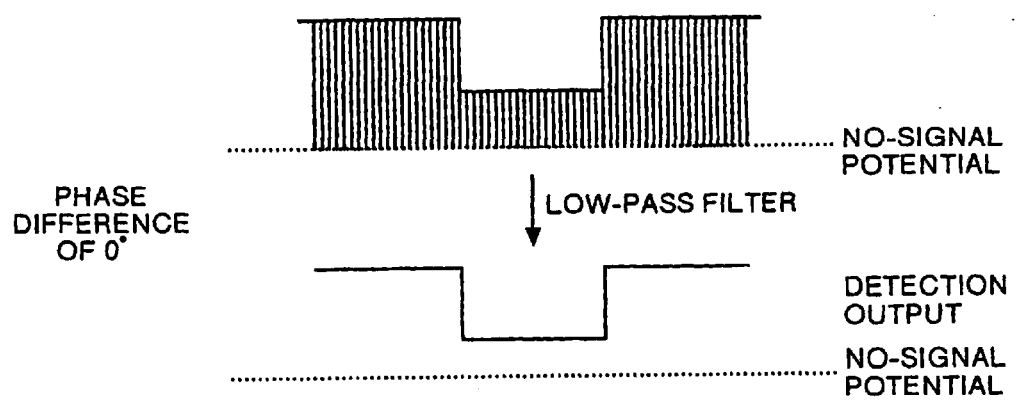
FIG. 2B is a diagram which shows a waveform of a detection output obtained when the detection output appears on the upper side (phase difference of 0 degrees)
Figure 2C:
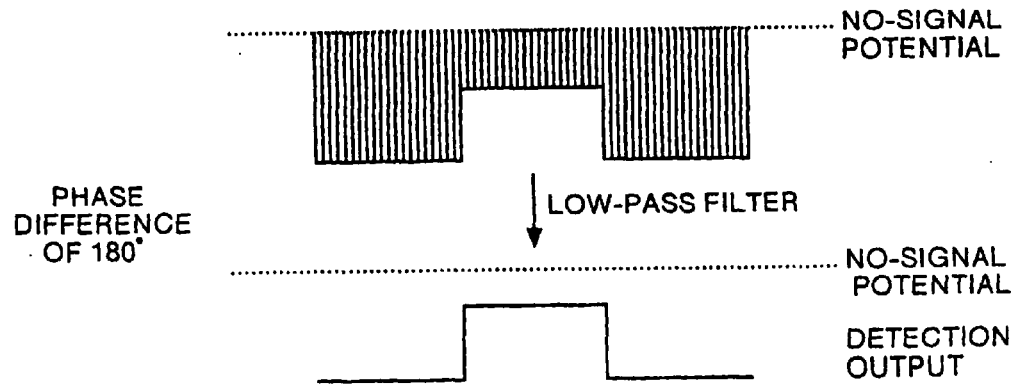
FIG. 2C is a diagram which shows the waveform of a detection output obtained when the detection output appears on the lower side (phase difference of 180 degrees)

When the polarity of the normal APC detector has an APC loop such that two inputs to the AM detector have a difference of 180 degrees, a detection output appears on the lower side of the no-signal potential at 100% or less. This phenomenon is shown in FIGS. 2A to 2C. FIG. 2A shows an example of a waveform obtained when an input signal is an AM modulation signal. FIG. 2B shows the waveform of a detection output when the detection output appears on the upper side (phase difference is 0 degrees). FIG. 2C is a diagram which shows the waveform of a detection output when the detection output appears on the lower side (phase difference is 180 degrees). It is assumed that LOCK detection detects that the APC loop is locked and that the detection output is output in a normal direction. It is considered that the APC loop is normally locked. In this state, when the input signal is overmodulated, the detection output exceeds the no-signal potential, and an output from the voltage comparator 10 becomes high. On the other hand, since the normal lock state is set, LOCK detection is also high. More specifically, an output from the AND circuit 11 becomes high. In this manner, the switch 12 is switched to the APC detection circuit 8 side having the opposite polarity, and an APC loop is set such that the two inputs of the AM detector have a phase difference of 0 degrees. Since the phases of the inputs are inverted at 180 degrees in overmodulation, the phase relationship between the input signals and the VOC is not changed around the change of the switch. More specifically, the detection output is not inverted.

As described above, according to the first embodiment, the APC filter is connected to the output terminal of the switch, the first APC detection circuit is connected to one of the input terminals of the switch, and the second APC detection circuit is connected to the other of the input terminals of the switch. The switch control circuit controls the switch based on an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be realized.

The first embodiment explains an event in which a detection output appears on the lower side of a no-signal potential, i.e., the event in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

Figure 3:
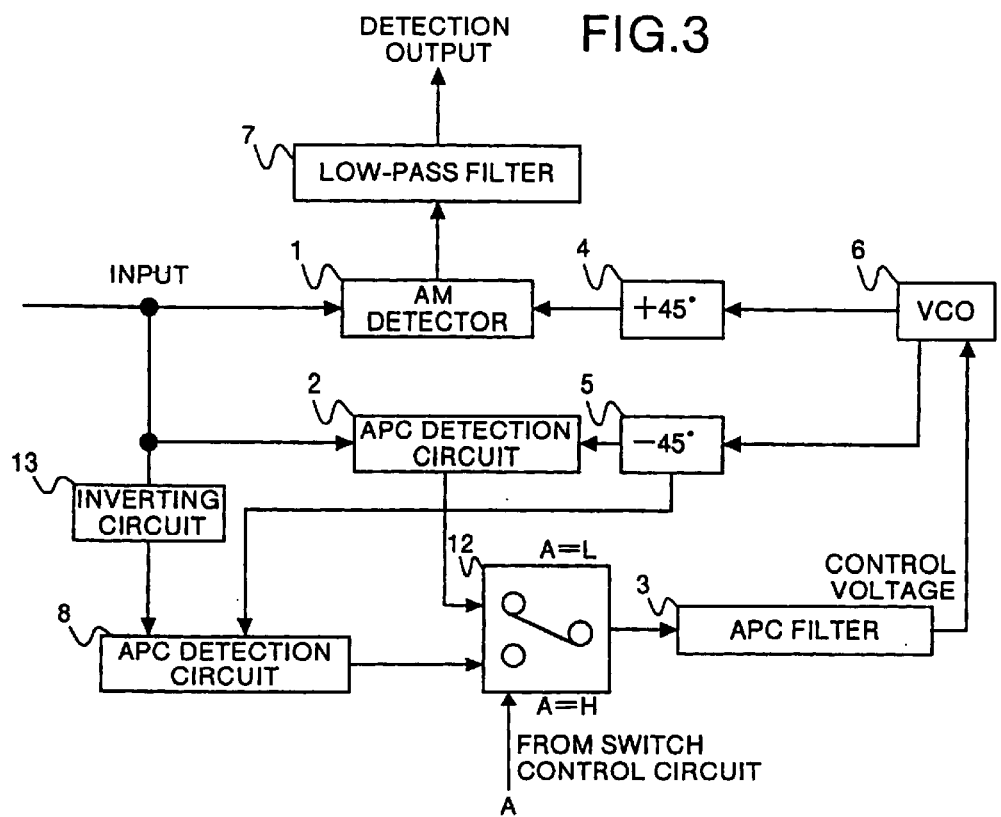
FIG. 3 is a block diagram which shows the configuration of an AM demodulation circuit according to the second embodiment of the present invention.

FIG. 3 is a block diagram which shows the configuration of an AM demodulation circuit according to the second embodiment of the present invention. In the AM demodulation circuit shown in FIG. 3, there is provided an inverting circuit 13 which inputs an inverted signal of the input signal into the APC detection circuit 8 that is connected to the switch 12. The other configuration of the AM demodulation circuit according to the second embodiment is the same as that of the AM demodulation circuit according to the first embodiment. The same reference numerals as in the first embodiment denote the same parts in the second embodiment. The configuration which realizes the control of the switch 12 is the same as that in FIG. 1, and that configuration has been omitted from FIG. 3 for the sake of simplicity.

The characteristic feature of the second embodiment is that the inverting circuit 13 is provided to supply the inverted polarity signal to the APC detection circuit 8 shown in FIG. 1. As a result, an APC loop that includes the APC detection circuit 2 operates such that the phase difference between two inputs of an AM detector is 180 degrees, and an APC loop that includes the APC detection circuit 8 operates such that the phase difference is 0 degrees. Therefore, a detection output is not inverted in around the change of the switch.

As described above, according to the second embodiment, the APC filter is connected to the output terminal of the switch, the first APC detection circuit is connected to one of the input terminals of the switch, and the second APC detection circuit is connected to the other of the input terminals of the switch. The switch control circuit controls the switch based on an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be realized.

The second embodiment explains an event in which a detection output appears on the lower side of a no-signal potential, i.e., the instance in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

Figure 4:
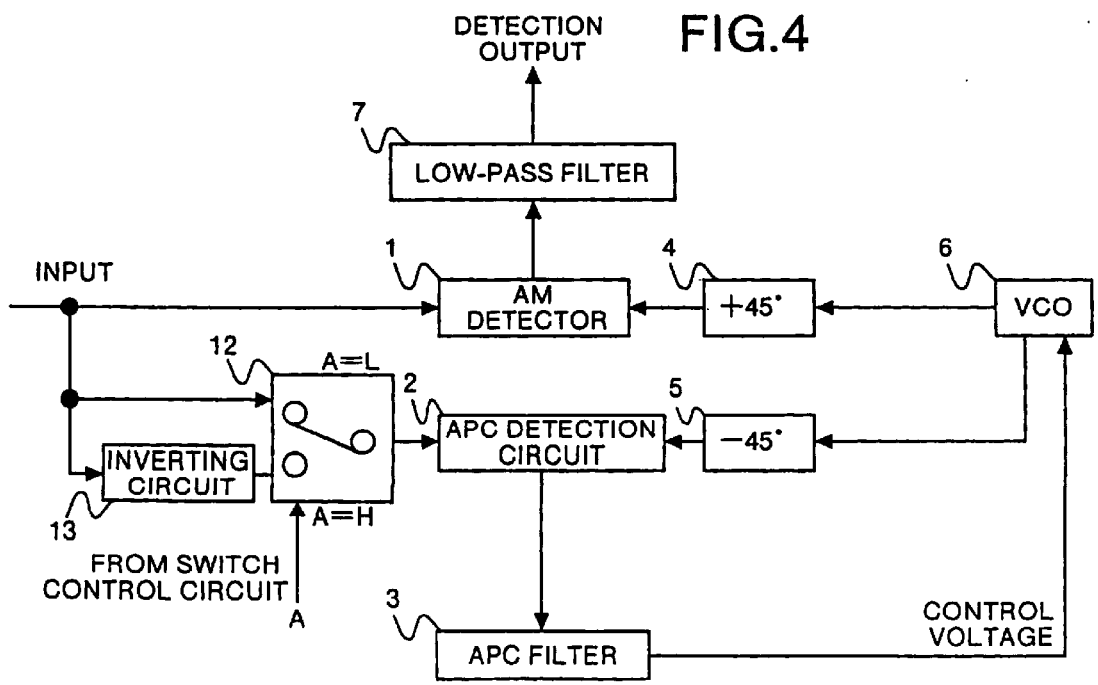
FIG. 4 is a block diagram which shows the configuration of an AM demodulation circuit according to the third embodiment of the present invention.

FIG. 4 is a block diagram which shows the configuration of an AM demodulation circuit according to the third embodiment of the present invention. In the AM demodulation circuit shown in FIG. 3, the two APC detection circuits are used. However, in the AM demodulation circuit shown in FIG. 4, the switch 12 and the inverting circuit 13 are provided between an input and the APC detection circuit 2. As a result, is not necessary to provided the APC detection circuit 8. The configuration which realizes the control of the switch 12 is the same as that in FIG. 1, and is not shown in FIG. 4. The other configuration of the AM demodulation circuit according to the third embodiment is the same as that of the AM demodulation circuit according to the first embodiment shown in FIG. 1. The same reference numerals as in the first embodiment denote the same parts in the third embodiment.

The characteristic feature of the third embodiment is that an inverting circuit which does not simultaneously operates in normal modulation and overmodulation is shared in normal modulation and overmodulation. The operational principle of the third embodiment is the same as that of the second embodiment. Therefore, a detection output is not inverted in around the change of the switch.

As described above, according to the third embodiment, the APC detection circuit is connected to the output terminal of the switch, the output terminal of an AM modulation signal is connected to one of the input terminals of the switch, and an inverting circuit is connected to the other of the input terminals of the switch. The switch control circuit controls the switch based on an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be realized.

The third embodiment explains an event in which a detection output appears on the lower side of a no-signal potential, i.e., the instance in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

Figure 5:
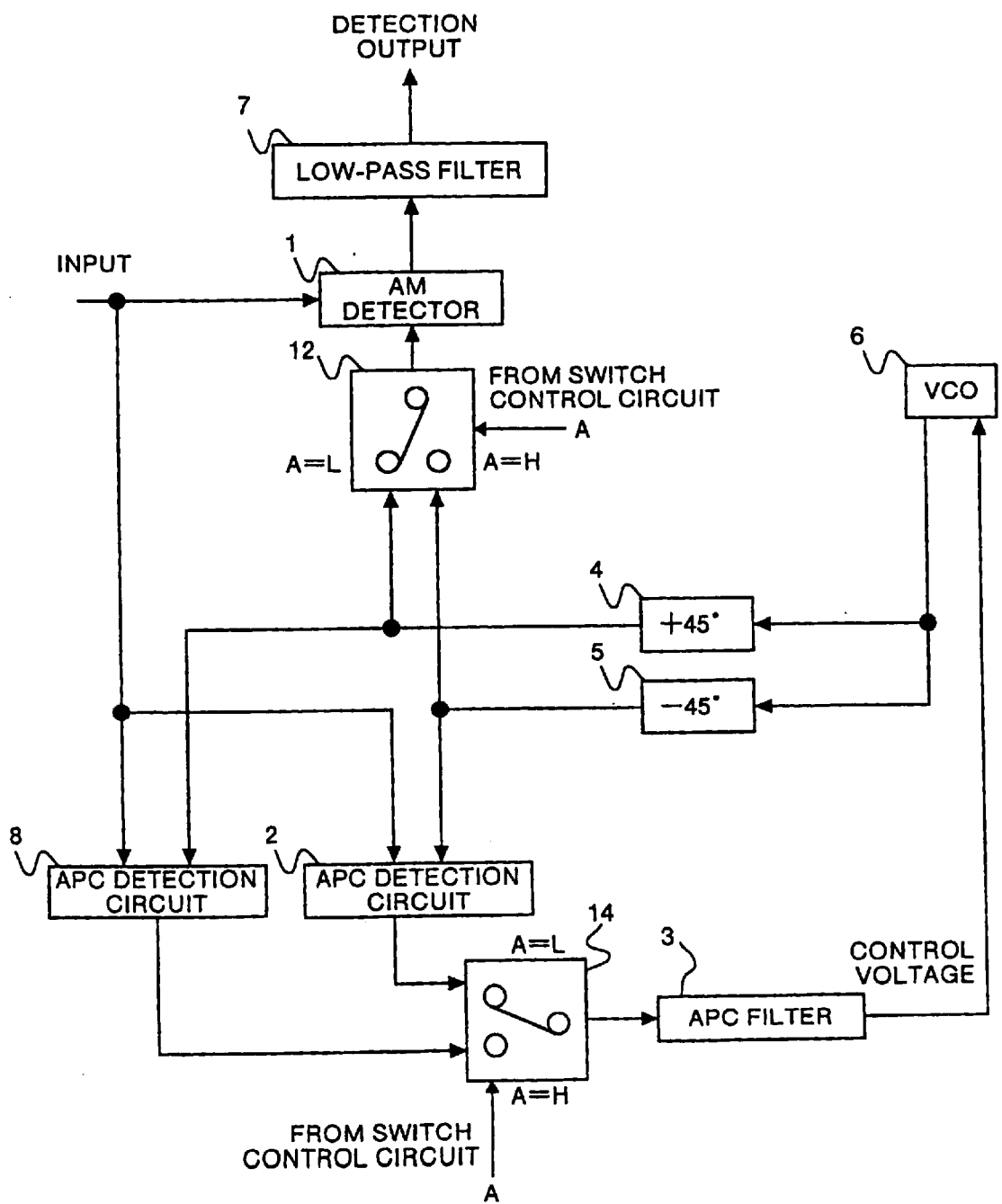
FIG. 5 is a block diagram which shows the configuration of an AM demodulation circuit according to the fourth embodiment of the present invention.

FIG. 5 is a block diagram which shows the configuration of an AM demodulation circuit according to the fourth embodiment of the present invention. The AM demodulation circuit shown in FIG. 5 is different from the AM demodulation circuit shown in FIG. 4 in that (1) a signal output from the phase shift circuit 4 is also distributed to the APC detection circuit 2 and a signal output from the phase shift circuit 5 is also distributed to the APC detection circuit 8, and (2) a signal to be input into the AM detector 1 out of the signals output from the phase shift circuits 4 and 5 is selected using a switch 12. A configuration which realize the control of a switch 12 and the switch 14 is the same as that in FIG. 1, and is not shown in FIG. 5. The other configuration is the same as that in the first embodiment shown in FIG. 1. The same reference numerals as in the first embodiment shown in FIG. 1 denote the same parts in the fourth embodiment.

Figure 12:
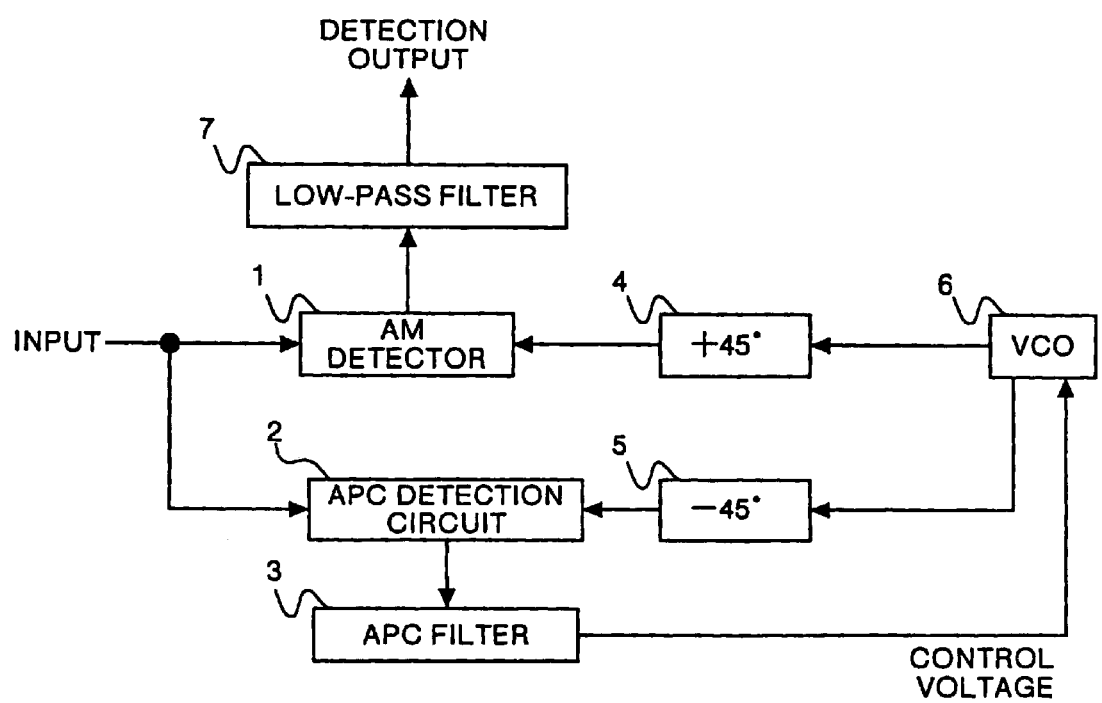
FIG. 12 is a diagram which shows the configuration of an example of an AM demodulation circuit using a conventional PLL.
Figure 13A:
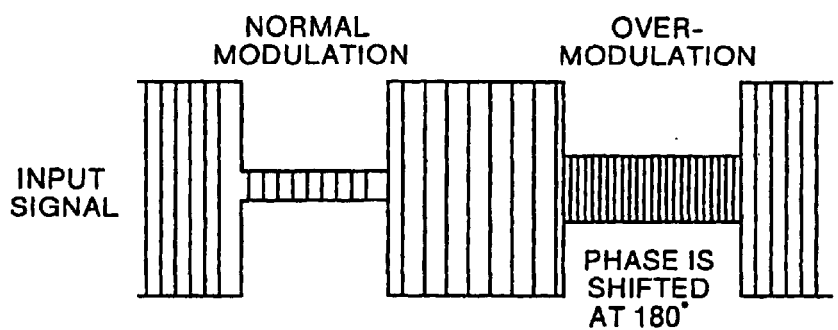
FIG. 13A is a diagram which shows the waveform of modulation signals obtained in normal modulation and overmodulation.
Figure 13B:
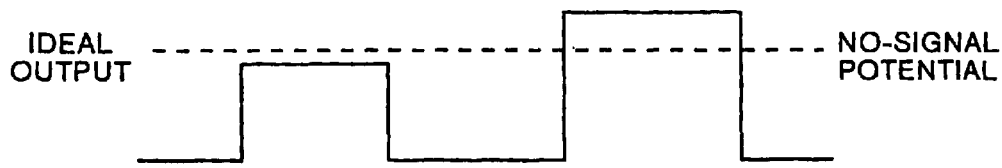
FIG. 13B is a diagram which shows an ideal output waveform obtained when the modulation signal is input.
Figure 13C:
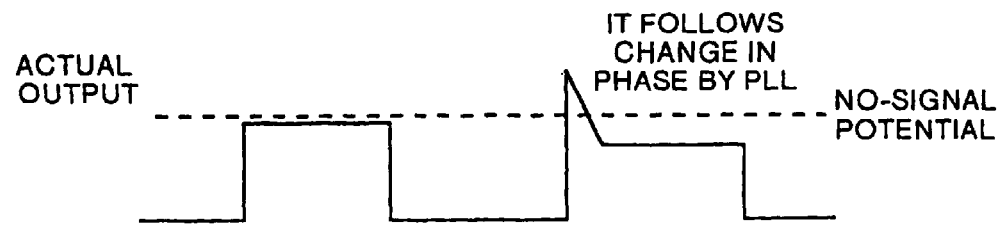
FIG. 13C is a diagram which shows an actual output waveform.

A switching operation of an APC loop is as follows. When the signal A input into the switches 12 and 14 is at low logical level (A=L), a signal output from the +45 degrees phase shift circuit 4 is input into the AM detector 1, and a signal output from the −45 degrees phase shift circuit 5 is input into the APC detection circuit 2. More specifically, the same operation as that of the conventional circuit shown in FIG. 12 is performed. On the other hand, when the signal A input into the switches 12 and 14 is at high logical level (A=H), a signal output from the −45 degrees phase shift circuit 5 is input into the AM detector 1, and a signal output from the −45 degrees phase shift circuit 4 is input into the APC detection circuit 8. As a result, when logical level of the signal A changes from high (H) to low (L), a phase difference between a signal input to an APC filter 3 and a signal input from the VCO 6 to the AM detector 1 is switched from −90 to +90 degrees. More specifically, the polarity of the APC loop is inverted. Therefore, a detection output is not inverted in around the change of the switch.

As described above, according to the fourth embodiment, the AM detector is connected to the output terminal of the first switch, the first phase shifter is connected to one of the input terminals of the first switch, and the second phase shifter is connected to the other of the input terminals of the first switch. An APC filter is connected to the output terminal of the second switch, the first APC detection circuit is connected to one of the input terminals of the second switch, and the second APC detection circuit is connected to the other of the input terminals of the second switch. The switch control circuit controls the first and second switches by an AND signal between an output from the voltage comparator and a LOCK detection signal of a PLL such that one of the input terminals of each of the first and second switches is selected in normal modulation and controls the first and second switches by the AND signal such that the other of the input terminals of each of the first and second switches is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be realized.

The fourth embodiment explains an event in which a detection output appears on the lower side of a no-signal potential, i.e., the instance in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

Figure 6:
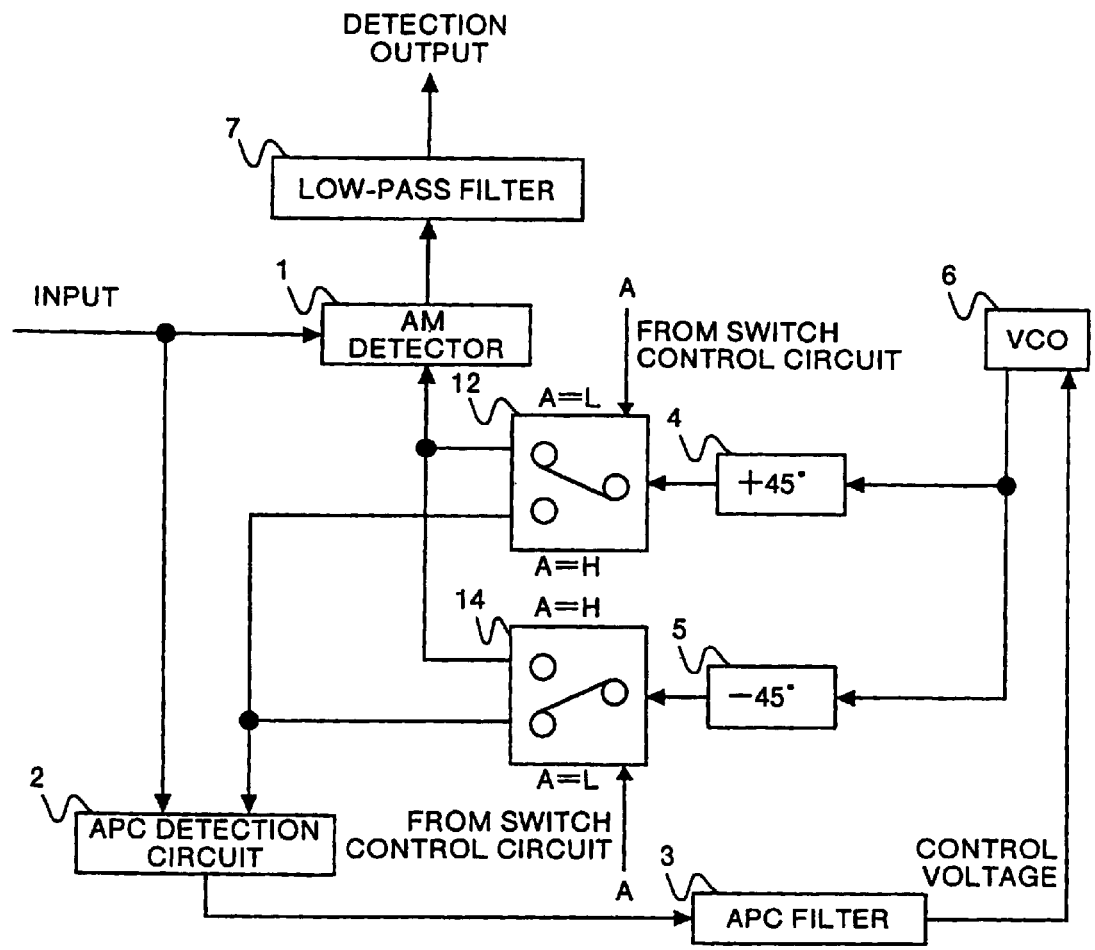
FIG. 6 is a block diagram which shows the configuration of an AM demodulation circuit according to the fifth embodiment of the present invention.

FIG. 6 is a block diagram which shows the configuration of an AM demodulation circuit according to the fifth embodiment of the present invention. The fifth embodiment is different from the fourth embodiment shown in FIG. 5 in that a signal input from a VCO 6 to an APC detection circuit 2 is switched by the switches 12 and 14. In this manner, it is enough to provided only one APC detection circuit. The configuration which realizes the control of the switch 12 or the switch 14 is the same as that in FIG. 1, and is not shown in FIG. 6. The other configuration is the same as that in the first embodiment shown in FIG. 1. The same reference numerals as in FIG. 1 denote the same parts in FIG. 6.

The characteristic feature of the fifth embodiment is that the inputs and the outputs of the switch 12 and the switch 14 are converted to each other, i.e., the input switching functions of the switch 12 and the switch 14 are changed into output switching functions to share the APC detection circuit in normal modulation and overmodulation. Therefore, as in the fourth embodiment, a detection output is not inverted in around the change of the switch.

As described above, according to the fifth embodiment, the first phase shifter is connected to the input terminal of the first switch, the AM detector is connected to one of the output terminals of the first switch, and the APC detection circuit is connected to the other of the output terminals of the first switch. The second phase shifter is connected to the input terminal of the second switch, the APC detection circuit is connected to one of the output terminals of the second switch, and the AM detector is connected to the other of the output terminals of the second switch. The switch control circuit controls the first and second switches by an AND signal between an output from the voltage comparator and a LOCK detection signal of a PLL such that one of the input terminals of each of the first and second switches is selected in normal modulation and controls the first and second switches by the AND signal such that the other of the input terminals of each of the first and second switches is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be realized.

The fifth embodiment explains an event in which a detection output appears on the lower side of a no-signal potential, i.e., the instance in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

FIG. 7 is a block diagram which shows the configuration of an AM demodulation circuit according to the sixth embodiment of the present invention. In this sixth embodiment, an inverted signal to be input into the APC detection circuit 2 is not obtained from the input signal but obtained from an output of the phase shift circuit 5. A configuration which realizes the control of a switch 12 is the same as that in the first embodiment shown in FIG. 1, and is not shown in FIG. 6. The other configuration is the same as that of the first embodiment shown in FIG. 1. The same reference numerals as in FIG. 1 denote the same parts in FIG. 6.

The characteristic feature of the sixth embodiment is that a switching operation is performed by checking whether a signal input from the VCO 6 to the APC detection circuit 2 is inverted or not. Since the inverting operation is an operation of shifting a phase by 180 degrees, a phase difference between a signal input to the APC detection circuit 2 and a signal input from the VCO 6 to the AM detector 1 when the signal A input into the switch 12 changes from H to L is switched from −90 to +90 degrees. More specifically, the polarity of the APC loop is inverted. Therefore, as in the fourth embodiment, a detection output is not inverted in around the change of the switch.

As described above, according to the sixth embodiment, the APC detection circuit is connected to the output terminal of the switch, the second phase shifter is connected to one of the input terminals of the switch, and an inverting circuit is connected to the other of the input terminals of the switch. The switch control circuit controls the switch by an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be realized.

The sixth embodiment explains an event in which a detection output appears on the lower side of a no-signal potential, i.e., the instance in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

FIG. 8 is a block diagram which shows the configuration of an AM demodulation circuit according to the seventh embodiment of the present invention. In the sixth embodiment shown in FIG. 7, the switch 12 and the inverting circuit 13 are provided between the phase shift circuit 5 and the APC detection circuit 2. However, in the seventh embodiment, the switch 12 and the inverting circuit 13 are provided between the phase shift circuit 4 and the AM detector 1. A configuration which realizes the control of a switch 12 is the same as that in the first embodiment shown in FIG. 1, and is not shown in FIG. 7. The other configuration is the same as that of the first embodiment shown in FIG. 1. The same reference numerals as in FIG. 1 denote the same parts in FIG. 7.

The characteristic feature of the seventh embodiment is as follows. That is, since an input signal input to the AM detector 1 and an output from the switch 12 have the same phase when the PLL is locked, an output phase of a VCO 6 is adjusted to the phase, and an output from the VCO 6 is distributed to the phase shift circuit 4 and the phase shift circuit 5. For this reason, the same operation as that in the sixth embodiment shown in FIG. 7 is performed. Therefore, as in the sixth embodiment, a detection output is not inverted in around the change of the switch.

As described above, according to the seventh embodiment, the AM detector is connected to the output terminal of the switch, the first phase shifter is connected to one of the input terminals of the switch, and an inverting circuit is connected to the other of the input terminals of the switch. The switch control circuit controls the switch by an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be realized.

The seventh embodiment explains an event in which a detection output appears on the lower side of a no-signal potential, i.e., the instance in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

Figure 9:
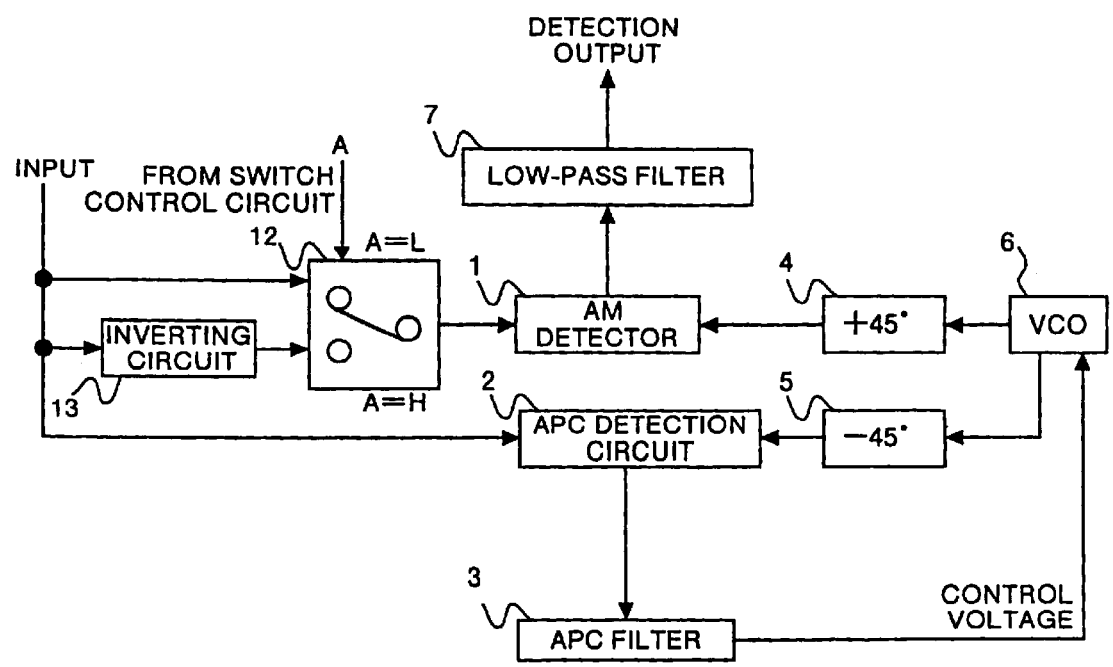
FIG. 9 is a block diagram which shows the configuration of an AM demodulation circuit according to the eighth embodiment of the present invention.

FIG. 9 is a block diagram which shows the configuration of an AM demodulation circuit according to the eighth embodiment of the present invention. According to the seventh embodiment shown in FIG. 8, the switch 12 and the inverting circuit 13 are provided between the phase shift circuit 4 and the AM detector 1. However, according to the eighth embodiment shown in FIG. 9, the switch 12 and the inverting circuit 13 are provided between the input signal and the AM detector 1. Thus, the input signal is inverted and input into the AM detector 1 when the signal A is at high logical level (A=H). A configuration which realizes the control of a switch 12 is the same as that in the first embodiment shown in FIG. 1, and is not shown in FIG. 9. The other configuration is the same as that of the first embodiment shown in FIG. 1. The same reference numerals as in FIG. 1 denote the same parts in FIG. 9.

The characteristic feature of the eighth embodiment is that a switching operation is performed by checking whether an input signal input to the AM detector is inverted or not. For this reason, when the input signal is inverted in overmodulation, the input signal to the AM detector is also inverted. Therefore, the phase of a signal input to the AM detector is not changed. Since a signal input to the APC detection circuit is an input signal which is not inverted, the signal is inverted by overmodulation. However, since the APC loop follows the change in phase, the phase difference between two inputs to the AM detector is switched from 180 to 0 degrees. Therefore, accordingly, a detection output is not inverted in around the change of the switch.

As described above, according to the eighth embodiment, the AM detector is connected to the output terminal of the switch, the output terminal of an AM modulation signal is connected to one of the input terminals of the switch, and an inverting circuit is connected to the other of the input terminals of the switch. The switch control circuit controls the switch by an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be realized.

The eighth embodiment explains an event in which a detection output appears on the lower side of a no-signal potential, i.e., the instance in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

Figure 10:
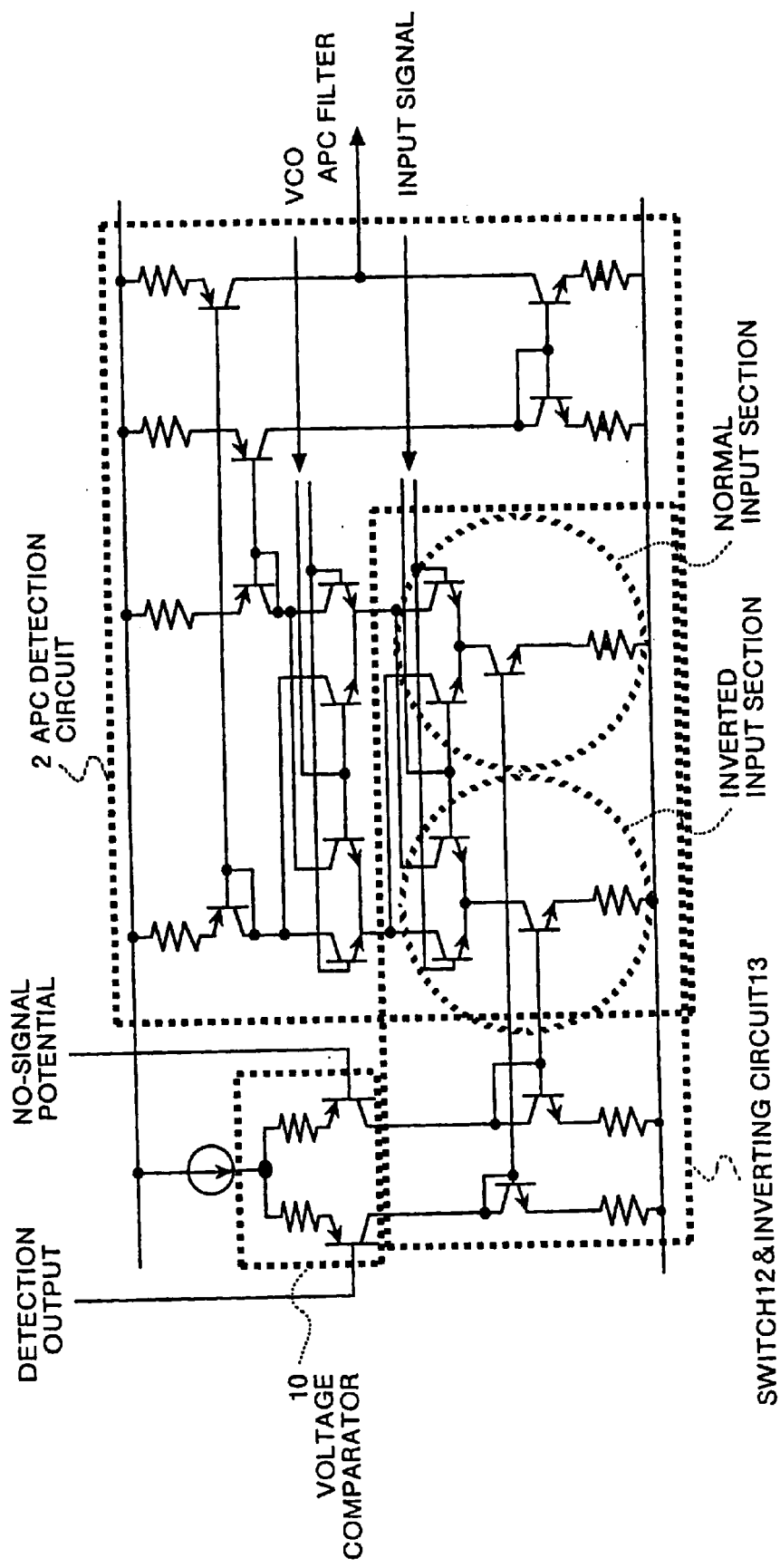
FIG. 10 is a block diagram which shows the configuration of an AM demodulation circuit according to the ninth embodiment of the present invention.

FIG. 10 shows a circuit that realizes the APC detection circuit 2, the voltage comparator 10 (omitted from the figure), the switch 12, and the inverting circuit 13 shown in FIG. 3. The circuit shown in FIG. 10 operates as follows. The voltage comparator 10 compares a detection output with a no-signal potential. When the detection output is lower than the no-signal potential, a circuit current of a normal input section increases. In contrast to this, when the detection output is higher than the no-signal potential, a circuit current of an inverted input section increases. The current of the normal input section and the current of the inverted input section to each other in the APC detection circuit 2, the section having a larger current has a superiority, and an APC loop is locked. More specifically, the normal input section side has a superiority in normal modulation, and the inverted input section side has a superiority in overmodulation. In this manner, APC switching continuously changes, and stable switching can be performed. In addition, since the switching can be made sharp or moderate by adjusting the gain of the voltage comparator 10, a switching speed depending on an input signal can be set.

As described above, according to the ninth embodiment, APC detection is performed with a normal polarity in normal modulation, and APC detection is performed with an inverted polarity in overmodulation. Therefore, an AM demodulation circuit which prevents the output from being inverted in overmodulation without stopping an APC operation can be realized.

The ninth embodiment explains an event in which a detection output appears on the lower side of a no-signal potential, i.e., the instance in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

Figure 11:
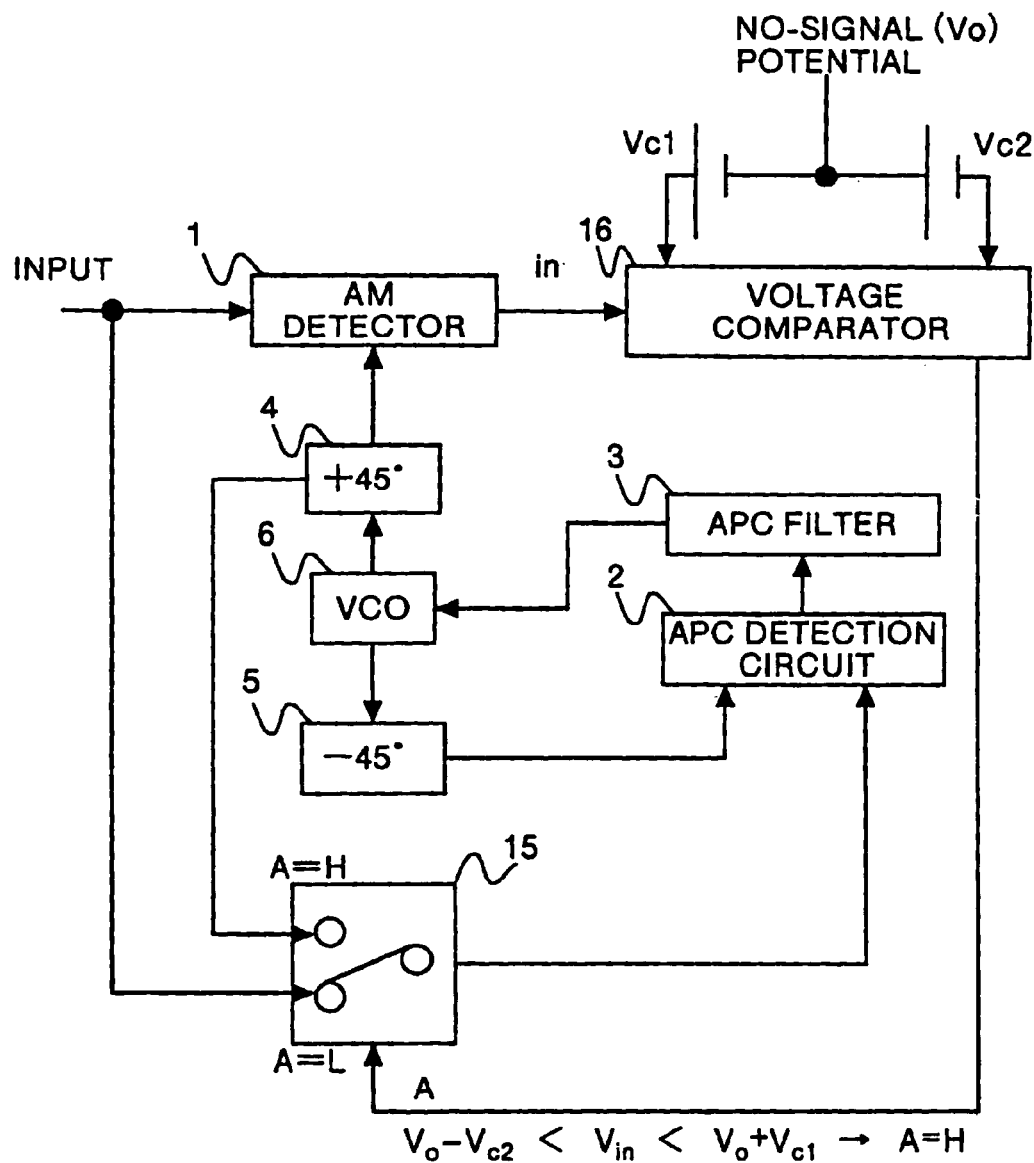
FIG. 11 is a block diagram which shows the configuration of an AM demodulation circuit according to the tenth embodiment of the present invention.

In each of the first to ninth embodiments described above, since the amplitude of a detection signal is small when the degree of modulation of an input signal is close to 100%, an input signal to an APC detection circuit becomes small accordingly. In a general APC detection circuit, when the input signal is small, a static phase error increases, and a correct phase relationship cannot be kept. Polarity switching of an APC loop may not be properly performed because of the static phase error. The circuit which is to prevent the static phase error is shown in FIG. 11. FIG. 11 is a block diagram which shows the configuration of an AM demodulation circuit according to the tenth embodiment of the present invention. The circuit shown in FIG. 11 is a circuit in which a signal obtained by shifting an output from the VCO 6 by +45 degrees is input into the APC detection circuit 2 in place of an input signal when an output of the detection signal is small. In an ordinary phase control detection circuit, since a phase difference between two input signals is 90 degrees, an input signal is small, a signal which is shifted by ±45 degrees is input to the APC detection circuit to input signals having a phase difference of 90 degrees, so that a current APC loop can be maintained. Since the input signal is an AM signal, the phase of the input signal does not change. For this reason, after the loop is properly locked, the phase relationship may be held, so that outputs from the VCO having a phase difference of 90 degrees may be input. Therefore, at a portion where a static phase error increases when the amplitude of the input signal is small to shift the phase relationship, the characteristics can be improved by using the above method.

FIG. 11 shows switching an input signal to the APC detection circuit 2 using the voltage comparator. When the amplitude of the input signal A is small as shown in FIG. 11, i.e., when a detection output is close to a no-signal potential, the static phase error characteristics described above can be improved by using an output from the VCO in place of the input signal. It is assumed that an output potential of an AM detector is represented by $V_{in}$, that two reference potentials are represented by $V_{c1}$ and $V_{c2}$, respectively, and that a no-signal potential which is a signal potential of a detection output when the AM signal is not modulated is represented by $V_o$. In this state, when a condition $$V_{in} > V_o + V_{c1} \text{ or } V_{in} < V_o - V_{c2}$$

is satisfied, an AM modulation signal may be selected. When a condition $$V_o - V_{c2} < V_{in} < V_o + V_{c1}$$

is satisfied, a signal obtained by causing an output from the VCO 6 to pass through a phase shift circuit 4 may be selected. The reference potentials $V_{c1}$ and $V_{c2}$ can be determined by the static phase error characteristics of APC. The tenth embodiment can be applied to the circuits described in the first to ninth embodiments.

As described above, according to the tenth embodiment, the APC detection circuit is connected to the output terminal of the third switch, the input terminal of the AM modulation signal is connected to one of the input terminals of the third switch, and an output signal of a second phase shift circuit is connected to the other of the input terminals of the third switch. It is assumed that an output potential of the AM detector is represented by $V_{in}$, that two reference potentials are represented by $V_{c1}$ and $V_{c2}$, respectively, and that a no-signal potential which is a signal potential of a detection output when the AM signal is not modulated is represented by $V_o$. In this state, when the condition $$V_{in} > V_o + V_{c1} \text{ or } V_{in} < V_o - V_{c2}$$

is satisfied, the voltage controller connected between the AM detector and the third switch selects one input terminal connected to the third switch. When the condition $$V_o - V_{c2} < V_{in} < V_o + V_{c1}$$

is satisfied, the voltage controller selects the other input terminal connected to the third switch. For this reason, improvement in characteristic with a small input signal and improvement in characteristic in APC switching according to the improvement in characteristic with a small input signal can be achieved.

The tenth embodiment explains the instance in which a detection output appears on the lower side of a no-signal potential, i.e., the instance in which two inputs to the AM detector have a phase difference of 180 degrees. However, when the detection output appears on the upper side, i.e., when the phase difference between two signals input to the AM detector is 0 degrees, the same configuration and the same effect can be achieved as a matter of course.

As has been described above, according to one aspect of the present invention, the APC filter is connected to the output terminal of the switch, the first APC detection circuit is connected to one of the input terminals of the switch, and the second APC detection circuit is connected to the other of the input terminals of the switch. The switch control circuit controls the switch by an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be advantageously realized.

According to another aspect of the present invention, the APC filter is connected to the output terminal of the switch, the first APC detection circuit is connected to one of the input terminals of the switch, and the second APC detection circuit is connected to the other of the input terminals of the switch. The switch control circuit controls the switch by an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be advantageously realized.

According to still another aspect of the present invention, the APC detection circuit is connected to the output terminal of the switch, the output terminal of an AM modulation signal is connected to one of the input terminals of the switch, and an inverting circuit is connected to the other of the input terminals of the switch. The switch control circuit controls the switch by an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be advantageously realized.

According to still another aspect of the present invention, the AM detector is connected to the output terminal of the first switch, the first phase shifter is connected to one of the input terminals of the first switch, and the second phase shifter is connected to the other of the input terminals of the first switch. An APC filter is connected to the output terminal of the second switch, the first APC detection circuit is connected to one of the input terminals of the second switch, and the second APC detection circuit is connected to the other of the input terminals of the second switch. The switch control circuit controls the first and second switches by an AND signal between an output from the voltage comparator and a LOCK detection signal of a PLL such that one of the input terminals of each of the first and second switches is selected in normal modulation and controls the first and second switches by the AND signal such that the other of the input terminals of each of the first and second switches is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be advantageously realized.

According to still another aspect of the present invention, the first phase shifter is connected to the input terminal of the first switch, the AM detector is connected to one of the output terminals of the first switch, and the APC detection circuit is connected to the other of the output terminals of the first switch. The second phase shifter is connected to the input terminal of the second switch, the APC detection circuit is connected to one of the output terminals of the second switch, and the AM detector is connected to the other of the output terminals of the second switch. The switch control circuit controls the first and second switches by an AND signal between an output from the voltage comparator and a LOCK detection signal of a PLL such that one of the input terminals of each of the first and second switches is selected in normal modulation and controls the first and second switches by the AND signal such that the other of the input terminals of each of the first and second switches is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be advantageously realized.

According to still another aspect of the present invention, the APC detection circuit is connected to the output terminal of the switch, the second phase shifter is connected to one of the input terminals of the switch, and an inverting circuit is connected to the other of the input terminals of the switch. The switch control circuit controls the switch by an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be advantageously realized.

According to still another aspect of the present invention, the AM detector is connected to the output terminal of the switch, the first phase shifter is connected to one of the input terminals of the switch, and an inverting circuit is connected to the other of the input terminals of the switch. The switch control circuit controls the switch by an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be advantageously realized.

According to still another aspect of the present invention, the AM detector is connected to the output terminal of the switch, the output terminal of an AM modulation signal is connected to one of the input terminals of the switch, and an inverting circuit is connected to the other of the input terminals of the switch. The switch control circuit controls the switch by an AND signal between an output from the voltage comparator and a LOCK detection signal of a PLL such that one of the input terminals of the switch is selected in normal modulation and controls the switch by the AND signal such that the other of the input terminals of the switch is selected in overmodulation. For this reason, APC detection is performed with a normal polarity in normal modulation, and APC detection is performed with an inverted polarity in overmodulation. Therefore, an AM demodulation circuit which prevents the output from being inverted in overmodulation without stopping an APC operation can be advantageously realized.

Moreover, the APC detection circuit is connected to the output terminal of the third switch, the input terminal of the AM modulation signal is connected to one of the input terminals of the third switch, and an output signal of a second phase shift circuit is connected to the other of the input terminals of the third switch. It is assumed that an output potential of the AM detector is represented by $V_{in}$, that two reference potentials are represented by $V_{c1}$ and $V_{c2}$, respectively, and that a no-signal potential which is a signal potential of a detection output when the AM signal is not modulated is represented by $V_o$. In this state, when a condition, $V_{in} > V_o + V_{c1}$ or $V_{in} < V_o - V_{c2}$ is satisfied, the voltage controller connected between the AM detector and the third switch selects one input terminal connected to the third switch. When a condition, $V_o - V_{c2} < V_{in} < V_o + V_{c1}$ is satisfied, the voltage controller selects the other input terminal connected to the third switch. For this reason, improvement in characteristic with a small input signal and improvement in characteristic in APC switching according to the improvement in characteristic with a small input signal can be advantageously achieved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An amplitude modulation demodulation circuit comprising:

an amplitude modulation detector which produces an amplitude modulation detection signal based on an amplitude modulation signal and an amplitude modulation detection reference signal and outputs the amplitude modulation detection signal;

a first automatic phase control detection circuit which generates an automatic phase control detection signal having a normal polarity from the amplitude modulation signal and an automatic phase control detection reference signal;

a second automatic phase control detection circuit which generates an automatic phase control detection signal having an inverted polarity with respect to the normal polarity signal generated by the first automatic phase control detection circuit from the amplitude modulation signal and the automatic phase control detection reference signal;

an automatic phase control filter which smoothes the automatic phase control detection signal having the normal polarity or the inverted polarity to generate a control voltage;

a voltage controlled oscillator which produces a signal having a frequency controlled by the control voltage output from the automatic phase control filter to output an oscillation signal;

a first phase shifter which outputs the amplitude modulation detection reference signal based on the oscillation signal output by the voltage controlled oscillator;

a second phase shifter which outputs the automatic phase control detection reference signal based on the oscillation signal output by the voltage controlled oscillator;

a voltage comparator which compares a no-signal potential, which is a signal potential of a detection output when the amplitude modulation signal is not modulated, to the amplitude modulation detection signal;

a first switch with one output terminal and two input terminals, the output terminal being connected to the automatic phase control filter, a first of the input terminals being connected to the first automatic phase control detection circuit, and a second of the input terminals being connected to the second automatic phase control detection circuit; and a switch control circuit which controls the first switch in response to an AND signal of an output from the voltage comparator and a lock detection signal of a phase locked loop so that the first of the input terminals of the first switch is selected in normal modulation and controls the fist switch based on the AND signal so that the second of the input terminals of the first switch is selected in overmodulation.

2. The amplitude modulation demodulation circuit according to claim 1, further comprising:

a second switch with one output terminal and two input terminals, the output terminal being connected to the automatic phase control detection circuit, a first of the input terminals receiving the amplitude modulation signal, and a second of the input terminals being connected to the first phase shifter, wherein, when an output potential of the amplitude modulation detector is represented by $V_{in}$, two reference potentials are represented by $V_{c1}$ and $V_{c2}$, respectively, and a no-signal potential, which is a signal potential of a detection output when the amplitude modulation signal is not modulated, is represented by $V_o$, and when $V_{in}>V_o+V_{c1}$ or $V_{in}<V_o-V_{c2}$ is satisfied, the voltage controller connected between the amplitude modulation detector and the second switch selects the first input terminal of the second switch, and when $V_o-V_{c2}<V_{in}<V_o+V_{c1}$ is satisfied, the voltage controller selects the second input terminal of the second switch.

3. An amplitude modulation demodulation circuit comprising:

an amplitude modulation detector which produces an amplitude modulation detection signal based on an amplitude modulation signal and an amplitude modulation detection reference signal and outputs the amplitude modulation detection signal;

a first automatic phase control detection circuit which generates an automatic phase control detection signal having a normal polarity from the amplitude modulation signal and an automatic phase control detection reference signal;

a second automatic phase control detection circuit which generates an automatic phase control detection signal having the same polarity with respect to the normal polarity signal generated by the first automatic phase control detection circuit from the amplitude modulation signal and the automatic phase control detection reference signal;

an automatic phase control filter which smoothes the automatic phase control detection signal having the normal polarity to generate a control voltage;

a voltage controlled oscillator which produces a signal having a frequency controlled by the control voltage output from the automatic phase control filter to output an oscillation signal;

a first phase shifter which outputs the amplitude modulation detection reference signal based on the oscillation signal output by the voltage controlled oscillator;

a second phase shifter which outputs the automatic phase control detection reference signal based on the oscillation signal output by the voltage controlled oscillator;

an inverting circuit which inverts polarity of the amplitude modulation signal and supplies the amplitude modulation signal of inverted polarity to the second automatic phase control detection circuit;

a voltage comparator which compares a no-signal potential, which is a signal potential of a detection output when the amplitude modulation signal is not modulated, to the amplitude modulation detection signal;

a first switch with one output terminal and two input terminals, the output terminal being connected to the automatic phase control filter, a first of the input terminals being connected to the first automatic phase control detection circuit, and a second of the input terminals being connected to the second automatic phase control detection circuit; and a switch control circuit which controls the first switch in response to an AND signal of an output from the voltage comparator and a lock detection signal of a phase locked loop so that the first of the input terminals of the first switch is selected in normal modulation and controls the first switch based on the AND signal so that the second of the input terminals of the first switch is selected in overmodulation.

4. The amplitude modulation demodulation circuit according to claim 3, further comprising:

a second switch with one output terminal and two input terminals, the output terminal being connected to the automatic phase control detection circuit, a first of the input terminals receiving the amplitude modulation signal, and a second of the input terminals being connected to the first phase shifter, wherein, when an output potential of the amplitude modulation detector is represented by $V_{in}$, two reference potentials are represented by $V_{c1}$ and $V_{c2}$, respectively, and a no-signal potential, which is a signal potential of a detection output when the amplitude modulation signal is not modulated, is represented by $V_o$, and when $V_{in} > V_o + V_{c1}$ or $V_{in} < V_o - V_{c2}$ is satisfied, the voltage controller connected between the amplitude modulation detector and the second switch selects the first input terminal of the second switch, and when $V_o - V_{c2} < V_{in} < V_o + V_{c1}$ is satisfied, the voltage controller selects the second input terminal of the second switch.

5. An amplitude modulation demodulation circuit comprising:

an amplitude modulation detector which produces an amplitude modulation detection signal based on an amplitude modulation signal and an amplitude modulation detection reference signal and outputs the amplitude modulation detection signal;

an automatic phase control detection circuit which outputs an automatic phase control detection signal based on the amplitude modulation signal and an automatic phase control detection reference signal;

an automatic phase control filter which smoothes the automatic phase control detection signal to generate a control voltage;

a voltage controlled oscillator which produces a signal having a frequency controlled by the control voltage output from the automatic phase control filter to output an oscillation signal;

a first phase shifter which outputs the amplitude modulation detection reference signal based on the oscillation signal output by the voltage controlled oscillator;

a second phase shifter which outputs the automatic phase control detection reference signal based on the oscillation signal output by the voltage controlled oscillator;

an inverting circuit which inverts polarity of the amplitude modulation signal;

a voltage comparator which compares a no-signal potential, which is a signal potential of a detection output when the amplitude modulation signal is not modulated, to the amplitude modulation detection signal;

a first switch with one output terminal and two input terminals, the output terminal being connected to the automatic phase control detection circuit, a first of the input terminals being connected to the automatic modulation signal, and a second of the input terminals being connected to the inverting circuit; and a switch control circuit which controls the first switch in response to an AND signal of an output from the voltage comparator and a lock detection signal of a phase locked loop so that the first of the input terminals of the first switch is selected in normal modulation and controls the first switch based on the AND signal so that the second of the input terminals of the first switch is selected in overmodulation.

6. The amplitude modulation demodulation circuit according to claim 5, further comprising:

a second switch with one output terminal and two input terminals, the output terminal being connected to the automatic phase control detection circuit, a first of the input terminals receiving the amplitude modulation signal, and a second of the input terminals being connected to the first phase shifter wherein, when an output potential of the amplitude modulation detector is represented by $V_{in}$, two reference potentials are represented by $V_{c1}$ and $V_{c2}$, respectively, and a no-signal potential, which is a signal potential of a detection output when the amplitude modulation signal is not modulated is represented by $V_o$, and when $V_{in} > V_o + V_{c1}$ or $V_{in} < V_o - V_{c2}$ is satisfied, the voltage controller connected between the amplitude modulation detector and the a second switch selects the first input terminal of the second switch, and when $V_o - V_{c2} < V_{in} < V_o + V_{c1}$ is satisfied, the voltage controller selects the second input terminal of the second switch.

7. An amplitude modulation demodulation circuit comprising: an amplitude modulation detector which produces an amplitude modulation detection signal based on an amplitude modulation signal and an amplitude modulation detection reference signal and outputs the amplitude modulation detection signal;

a first automatic phase control detection circuit which generates an automatic phase control detection signal having a normal polarity from the amplitude modulation signal and an automatic phase control detection reference signal;

a second automatic phase control detection circuit which generates an automatic phase control detection signal having the same polarity as the normal polarity signal generated by the first automatic phase control detection circuit from the amplitude modulation signal and the automatic phase control detection reference signal;

an automatic phase control filter which smoothes the automatic phase control detection signal to generate a control voltage;

a voltage controlled oscillator which produces a signal having a frequency controlled by the control voltage output from the automatic phase control filter to output an oscillation signal;

a first phase shifter which outputs the amplitude modulation detection reference signal based on the oscillation signal output by the voltage controlled oscillator;

a second phase shifter which outputs the automatic phase control detection reference signal based on the oscillation signal output by the voltage controlled oscillator;

a voltage comparator which compares a no-signal potential which is a signal potential, of a detection output when the amplitude modulation signal is not modulated, to the amplitude modulation detection signal;

a first switch with one output terminal and two input terminals, the output terminal being connected to the amplitude modulation detector, a first of the input terminals being connected to the first phase shifter, and a second of the input terminals being connected to the second automatic phase control detection circuit;

a second switch with one output terminal and two input terminals, the output terminal being connected to the automatic phase control filter, a first of the input terminals being connected to the first automatic phase control detection circuit, and a second of the input terminals being connected to the second automatic phase control detection circuit; and a switch control circuit which controls the first and second switches in response to an AND signal of an output from the voltage comparator which simultaneously switches the input terminals connected to the first switch and the second switch and a lock detection signal of a phase locked loop so that the first of the input terminals of each of the first and second switches is selected in normal modulation and controls the first and second switches, based on the AND signal, so that the second of the input terminals of each of the first and second switches is selected in overmodulation.

8. The amplitude modulation demodulation circuit according to claim 7, further comprising:

a third switch with one output terminal and two input terminals, the output terminal being connected to the automatic phase control detection circuit, a first of the input terminals receiving the amplitude modulation signal, and a second of the input terminals being connected to the first phase shifter, and, wherein, when an output potential of the amplitude modulation detector is represented by $V_{in}$, two reference potentials are represented by $V_{c1}$ and $V_{c2}$, respectively, and a no-signal potential, which is a signal potential of a detection output when the amplitude modulation signal is not modulated, is represented by $V_o$, and when $V_{in} > V_o + V_{c1}$ or $V_{in} < V_o - V_{c2}$ is satisfied, the voltage controller connected between the amplitude modulation detector and the third switch selects the one input terminal of the third switch, and when $V_o - V_{c2} < V_{in} < V_o + V_{c1}$ is satisfied, the voltage controller selects the second input terminal of the third switch.

9. An amplitude modulation demodulation circuit comprising:

an amplitude modulation detector which produces an amplitude modulation detection signal based on an amplitude modulation signal and an amplitude modulation detection reference signal and outputs the amplitude modulation detection signal;

an automatic phase control detection circuit which outputs an automatic phase control detection signal based on the amplitude modulation signal and an automatic phase control detection reference signal;

an automatic phase control filter which smoothes the automatic phase control detection signal to generate a control voltage;

a voltage controlled oscillator which produces a signal having a frequency controlled by the control voltage output from the automatic phase control filter to output an oscillation signal;

a first phase shifter which outputs the amplitude modulation detection reference signal based on the oscillation signal output by the voltage controlled oscillator;

a second phase shifter which outputs the automatic phase control detection reference signal based on the oscillation signal output by the voltage controlled oscillator;

a voltage comparator which compares a no-signal potential, which is a signal potential of a detection output when the amplitude modulation signal is not modulated, to the amplitude modulation detection signal;

a first switch with one input terminal and two output terminals, the input terminal being connected to the first phase shifter, a first of the output terminals being connected to the amplitude modulation detector, and a second of the output terminals being connected to the automatic phase control detection circuit;

a second switch with one input terminal and two output terminals, the input terminal being connected to the second phase shifter, a first of the output terminals being connected to the automatic phase control detection circuit, and a second of the output terminals being connected to the amplitude modulation detector; and a switch control circuit which controls the first and second switches in response to an AND signal of an output from the voltage comparator which simultaneously switches the output terminals connected to the first switch and the second switch and a lock detection signal of a phase locked loop so that the first of the input terminals of each of the first and second switches is selected in normal modulation and controls the first and second switches based on the AND signal so that the second of the input terminals of each of the first and second switches is selected in overmodulation.

10. The amplitude modulation demodulation circuit according to claim 9, further comprising:

a third switch with one output terminal and two input terminals, the output terminal being connected to the automatic phase control detection circuit, a first of the input terminals receiving the amplitude modulation signal, and a second of the input terminals being connected to the first phase shifter, and, wherein, when an output potential of the amplitude modulation detector is represented by $V_{in}$, two reference potentials are represented by $C_{c1}$ and $V_{c2}$, respectively, and a no-signal potential which is a signal potential of a detection output when the amplitude modulation signal is not modulated is represented by $V_o$, and when $V_{in} > V_o + V_{c1}$ or $V_{in} < V_o - V_{c2}$ is satisfied, the voltage controller connected between the amplitude modulation detector and the third switch selects the first input terminal of the third switch, and when $V_o - V_{c2} < V_{in} < V_o + V_{c1}$ is satisfied, the voltage controller selects the second input terminal of the third switch.

11. An amplitude modulation demodulation circuit comprising:

an amplitude modulation detector which produces an amplitude modulation detection signal based on an amplitude modulation signal and an amplitude modulation detection reference signal and outputs the amplitude modulation detection signal;

an automatic phase control detection circuit which outputs an automatic phase control detection signal based on the amplitude modulation signal and an automatic phase control detection reference signal;

an automatic phase control filter which smoothes the automatic phase control detection signal to generate a control voltage;

a voltage controlled oscillator which produces a signal having a frequency controlled by the control voltage output from the automatic phase control filter to output an oscillation signal;

a first phase shifter which outputs the amplitude modulation detection reference signal based on the oscillation signal output by the voltage controlled oscillator;

a second phase shifter which outputs the automatic phase control detection reference signal based on the oscillation signal output by the voltage controlled oscillator;

an inverting circuit which inverts polarity of a signal output from the second phase shifter;

a voltage comparator which compares a no-signal potential which is a signal potential, of a detection output when the amplitude modulation signal is not modulated, to the amplitude modulation detection signal;

a first switch with one output terminal and two input terminals, the output terminal being connected to the automatic phase control detection circuit, a first of the input terminals being connected to the second phase shifter, and a second of the input terminals being connected to the inverting circuit; and a switch control circuit which controls the first switch in response to an AND signal of an output from the voltage comparator and a lock detection signal of a phase locked loop so that the first of the input terminals of the first switch is selected in normal modulation and controls the first switch in response to the AND signal so that the second of the input terminals of the first switch is selected in overmodulation.

12. The amplitude modulation demodulation circuit according to claim 11, further comprising:

a second switch with one output terminal and two input terminals, the output terminal being connected to the automatic phase control detection circuit, a first of the input terminals receiving the amplitude modulation signal, and a second of the input terminals being connected to the first phase shifter, and, wherein, when an output potential of the amplitude modulation detector is represented by $V_{in}$, two reference potentials are represented by $V_{c1}$ and $V_{c2}$, respectively, and a no-signal potential, which is a signal potential of a detection output when the amplitude modulation signal is not modulated, is represented by $V_o$, and when $V_{in} > V_o + V_{c1}$ or $V_{in} < V_o - V_{c2}$ is satisfied, the voltage controller connected between the amplitude modulation detector and the second switch selects the first input terminal of the second switch, and when $V_o - V_{c2} < V_{in} < V_o + V_{c1}$ is satisfied, the voltage controller selects the second input terminal of the second switch.

13. An amplitude modulation demodulation circuit comprising:

an amplitude modulation detector which produces an amplitude modulation detection signal based on an amplitude modulation signal and an amplitude modulation detection reference signal and outputs the amplitude modulation detection signal;

an automatic phase control detection circuit which outputs an automatic phase control detection signal based on the amplitude modulation signal and an automatic phase control detection reference signal;

an automatic phase control filter which smoothes the automatic phase control detection signal to generate a control voltage;

a voltage controlled oscillator which produces a signal having a frequency controlled by the control voltage output from the automatic phase control filter to output an oscillation signal;

a first phase shifter which outputs the amplitude modulation detection reference signal based on the oscillation signal output by the voltage controlled oscillator;

a second phase shifter which outputs the automatic phase control detection reference signal based on the oscillation signal output by the voltage controlled oscillator;

an inverting circuit which inverts polarity of a signal output from the first phase shifter;

a voltage comparator which compares a no-signal potential which is a signal potential, of a detection output when the amplitude modulation signal is not modulated, to the amplitude modulation detection signal;

a first switch with one output terminal and two input terminals, the output terminal being connected to the amplitude modulation detector, a first of the input terminals being connected to the first phase shifter, and a second of the input terminals being connected to the inverting circuit; and a switch control circuit which controls the first switch in response to an AND signal of an output from the voltage comparator and a lock detection signal of a phase locked loop so that the first of the input terminals of the first switch is selected in normal modulation and controls the first switch based on the AND signal so that the second of the input terminals of the first switch is selected in overmodulation.

14. The amplitude modulation demodulation circuit according to claim 13, further comprising;

a second switch with one output terminal and two input terminals, the output terminal being connected to the automatic phase control detection circuit, a first of the input terminals receiving the amplitude modulation signal, and a second of the input terminals being connected to the first phase shifter, and, wherein, when an output potential of the amplitude modulation detector is represented by $V_{in}$, two reference potentials are represented by $V_{c1}$ and $V_{c2}$, respectively, and a no-signal potential, which is a signal potential of a detection output when the amplitude modulation signal is not modulated, is represented by $V_o$, and when $V_{in} > V_o + V_{c1}$ or $V_{in} < V_o - V_{c2}$ is satisfied, the voltage controller connected between the amplitude modulation detector and the second switch selects the first input terminal of the second switch, and when $V_o - V_{c2} < V_{in} < V_o + V_{c1}$ is satisfied, the voltage controller selects the second input terminal of the second switch.

15. An amplitude modulation demodulation circuit comprising:

an amplitude modulation detector which produces an amplitude modulation detection signal based on an amplitude modulation signal and an amplitude modulation detection reference signal and outputs the amplitude modulation detection signal;

an automatic phase control detection circuit which outputs an automatic phase control detection signal based on the amplitude modulation signal and an automatic phase control detection reference signal;

an automatic phase control filter which smoothes the automatic phase control detection signal to generate a control voltage;

a voltage controlled oscillator which produces a signal of a frequency controlled by the control voltage output from the automatic phase control filter to output an oscillation signal;

a first phase shifter which outputs the amplitude modulation detection reference signal based on the oscillation signal output by the voltage controlled oscillator;

a second phase shifter which outputs the automatic phase control detection reference signal based on the oscillation signal output by the voltage controlled oscillator;

an inverting circuit which inverts polarity of the amplitude modulation signal;

a voltage comparator which compares a no-signal potential, which is a signal potential of a detection output when the amplitude modulation signal is not modulated, to the amplitude modulation detection signal;

a first switch with one output terminal and two input terminals, the output terminal being connected to the amplitude modulation detector, a first of the input terminals receiving the amplitude modulation signal, and a second of the input terminals being connected to the inverting circuit; and a switch control circuit which controls the first switch in response to an AND signal of an output from the voltage comparator and a lock detection signal of a phase locked loop so that the first of the input terminals of the first switch is selected in normal modulation and controls the first switch based on the AND signal so that the second of the input terminals of the first switch is selected in overmodulation.

16. The amplitude modulation demodulation circuit according to claim 15, further comprising:

a second switch with one output terminal and two input terminals, the output terminal being connected to the automatic phase control detection circuit, a first of the input terminals receiving the amplitude modulation signal, and a second of the input terminals being connected to the first phase shifter, and, wherein, when an output potential of the amplitude modulation detector is represented by $V_{in}$, two reference potentials are represented by $V_{c1}$ and $V_{c2}$, respectively, and a no-signal potential, which is a signal potential of a detection output when the amplitude modulation signal is not modulated, is represented by $V_o$, and when $V_{in} > V_o + V_{c1}$ or $V_{in} < V_o - V_{c2}$ is satisfied, the voltage controller connected between the amplitude modulation detector and the second switch selects the first input terminal of the second switch, and when $V_o - V_{c2} < V_{in} < V_o + V_{c1}$ is satisfied, the voltage controller selects the second input terminal of the second switch.

* * * * *